US012696825B2

(12) United States Patent (10) Patent No.: US 12,696,825 B2
Iwashige et al. (45) Date of Patent: Jul. 28, 2026

(54) SEMICONDUCTOR DEVICE AND METHOD FOR MANUFACTURING THE SEMICONDUCTOR DEVICE

(71) Applicant: DENSO CORPORATION, Kariya-city (JP)

(72) Inventors: Tomohito Iwashige, Kariya-city (JP); Takeshi Endo, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 735 days.

(21) Appl. No.: 17/872,142

(22) Filed: Jul. 25, 2022

(65) Prior Publication Data

US 2022/0359229 A1 Nov. 10, 2022

Related U.S. Application Data

(63) Continuation of application No. PCT/JP2021/007916, filed on Mar. 2, 2021.

(30) Foreign Application Priority Data

Mar. 4, 2020 (JP) ................................. 2020-036939

(51) Int. Cl.
*H10W 95/00* (2026.01)
*H10W 72/00* (2026.01)
(Continued)

(52) U.S. Cl.
CPC ......... *H10W 95/00* (2026.01); *H10W 72/071* (2026.01); *H10W 72/30* (2026.01);
(Continued)

(58) Field of Classification Search
CPC ......... H01L 24/83; H01L 24/27; H01L 24/29; H01L 24/32; H01L 24/33; H01L 24/92;
(Continued)

(56) References Cited

U.S. PATENT DOCUMENTS 5,278,429 A * 1/1994 Takenaka ............ H10W 76/157
257/E23.125
5,476,633 A * 12/1995 Sokolowski ........ C22C 33/0285
75/246
(Continued)

FOREIGN PATENT DOCUMENTS

JP S62-69516 A 3/1987
JP 2016167527 A * 9/2016 ..... H01L 2224/0603
JP 2018-129352 A 8/2018

OTHER PUBLICATIONS

Greca et al., "Double Side Sintered IGBT 650V/ 200A in a TO-247 Package for Extreme Performance and Reliability", Electronics Packaging Technology Conference, 2016: pp. 1-4.
(Continued)

*Primary Examiner* — Eliseo Ramos Feliciano
*Assistant Examiner* — Brad A Knudson
(74) *Attorney, Agent, or Firm* — Posz Law Group, PLC

(57) ABSTRACT

Joining a second supporting member to one surface of a semiconductor chip through an upper layer joining portion includes: forming, on the one surface, a pre-joining layer by pressure-sintering a first constituent member containing a sintering material on the one surface such that spaces between the plurality of protrusions are filled with the pre-joining layer and the pre-joining layer has a flat surface on a side of the pre-joining layer away from the semiconductor chip; arranging, on the flat surface, the second supporting member through a second constituent member containing a sintering material; and heating and pressurizing the second constituent member. Thereby, an upper layer joining portion is formed by the second constituent member and the pre-joining layer.

17 Claims, 3 Drawing Sheets

(51) Int. Cl.

| | |
|---|---|
| *H10W 72/30* | (2026.01) |
| *H10W 90/00* | (2026.01) |
| *H10W 99/00* | (2026.01) |
| *B22F 3/10* | (2006.01) |

(52) U.S. Cl.

CPC ....... *H10W 72/352* (2026.01); *H10W 90/701* (2026.01); *H10W 99/00* (2026.01); *B22F 3/10* (2013.01); *H10W 72/0113* (2026.01); *H10W 72/01325* (2026.01); *H10W 72/01333* (2026.01); *H10W 72/01336* (2026.01); *H10W 72/01361* (2026.01); *H10W 72/07331* (2026.01); *H10W 72/07332* (2026.01); *H10W 72/322* (2026.01); *H10W 72/325* (2026.01); *H10W 90/734* (2026.01)

(58) Field of Classification Search

CPC . H01L 2224/27436; H01L 2224/27505; H01L 2224/2908; H01L 2224/29139; H01L 2224/29339; H01L 2224/32227; H01L 2224/83203; H01L 2224/8384; H01L 24/30; H10W 95/00; H10W 72/071; H10W 72/30; H10W 90/701; H10W 99/00; H10W 72/0113; H10W 72/01325; H10W 72/01333; H10W 72/01336; H10W 72/01361; H10W 72/07331; H10W 72/07332; H10W 72/322; H10W 72/325; H10W 72/352; H10W 90/734; H10W 90/736; B22F 3/10

See application file for complete search history.

(56) References Cited

U.S. PATENT DOCUMENTS

| | | | | |
|---|---|---|---|---|
| 2010/0252312 | A1* | 10/2010 | Wolde-Giorgis ....... | H01L 24/75 |
| | | | | 228/256 |
| 2011/0114706 | A1 | 5/2011 | Sasaoka et al. | |
| 2013/0216848 | A1* | 8/2013 | Kalich ............... | C22C 32/0021 |
| | | | | 228/248.1 |
| 2016/0240505 | A1* | 8/2016 | Tatsumi ................. | B23K 35/30 |
| 2017/0144221 | A1* | 5/2017 | Ghoshal .............. | B23K 3/0607 |
| 2019/0006265 | A1* | 1/2019 | Yamada .............. | H10D 12/411 |
| 2019/0279943 | A1* | 9/2019 | Soda ....................... | H01L 25/07 |
| 2020/0279791 | A1* | 9/2020 | Finarelli ................ | H01L 25/18 |
| 2020/0294956 | A1* | 9/2020 | Hartmann .............. | H01L 24/75 |
| 2021/0280534 | A1* | 9/2021 | Hokazono ............. | H01L 23/051 |

OTHER PUBLICATIONS

Siow et al., "Identifying the Development State of Sintered Silver (Ag) as a Bonding Material in the Microelectronic Packaging via a Patent Landscape Study", Journal of Electronic Packaging 138 (2016): pp. 020804-1-020804-13.

* cited by examiner

SEMICONDUCTOR DEVICE AND METHOD FOR MANUFACTURING THE SEMICONDUCTOR DEVICE

CROSS REFERENCE TO RELATED APPLICATIONS

The present application is a continuation application of International Patent Application No. PCT/JP2021/007916 filed on Mar. 2, 2021, which designated the U.S. and claims the benefit of priority from Japanese Patent Application No. 2020-036939 filed on Mar. 4, 2020. The entire disclosures of all of the above applications are incorporated herein by reference.

TECHNICAL FIELD

The present disclosure relates to a semiconductor device in which a semiconductor chip is arranged between a first supporting member and a second supporting member that face each other, and a method for manufacturing the same.

BACKGROUND

Conventionally, a semiconductor device in which a semiconductor chip is arranged between a first supporting member and a second supporting member that face each other and a lower layer joining portion is arranged between the semiconductor chip and the first supporting member and an upper joining portion is arranged between the semiconductor chip and the second supporting member has been proposed.

SUMMARY

According to one aspect of the present disclosure, a method for producing a semiconductor device that includes a semiconductor chip between a first supporting member and a second supporting member facing each other is provided. The method includes preparing the semiconductor chip including one surface having a plurality of protrusions and another surface opposite to the one surface, joining the first supporting member to the other surface of the semiconductor chip through a lower layer joining portion such that the other surface faces the first supporting member, and joining the second supporting member to the one surface of the semiconductor chip through an upper layer joining portion such that the one surface faces the second supporting member. The lower layer joining portion includes a pressure-sintered layer and the upper layer joining portion includes a pressure-sintered layer. The joining of the second supporting member to the one surface through the upper layer joining portion includes: forming, on the one surface, a pre-joining layer by pressure-sintering a first constituent member containing a sintering material on the one surface of the semiconductor chip such that spaces between the plurality of protrusions are filled with the pre-joining layer and the pre-joining layer is in contact with the plurality of protrusions and has a flat surface on a side of the pre-joining layer away from the semiconductor chip; arranging, on the flat surface of the pre-joining layer, the second supporting member through a second constituent member containing a sintering material; and heating and pressurizing the second constituent member. The upper layer joining portion is formed by the second constituent member and the pre-joining layer.

According to another aspect of the present disclosure, a semiconductor device includes a first supporting member, a second supporting member, a semiconductor chip, a lower layer joining portion, an upper layer joining portion. The semiconductor chip is disposed between the first supporting member and the second supporting member that face each other. The semiconductor chip includes one surface that includes a plurality of protrusions and faces the first supporting member and another surface that is opposite to the one surface and faces the second supporting member. The lower layer joining portion is disposed between the first supporting member and the semiconductor chip and formed of a pressure sintered layer. The upper layer joining portion is disposed between the second supporting member and the semiconductor chip. The upper layer joining portion includes a plurality of pressure-sintered layers and at least one intermediate metal layer disposed, as a supporting layer, between the plurality of pressure-sintered layers. One of the plurality of pressure-sintered layers facing the semiconductor chip is arranged to join the one surface of the semiconductor chip and the at least one intermediate metal layer such that spaces between the plurality of protrusions are filled with the one of the plurality of pressure-sintered layers and the one of the plurality of pressure-sintered layers is in contact with the plurality of protrusions. One of the plurality of pressure-sintered layers facing the second supporting member is arranged to join the at least one intermediate metal layer and the second supporting member.

DESCRIPTION OF EMBODIMENTS

Figure 1:
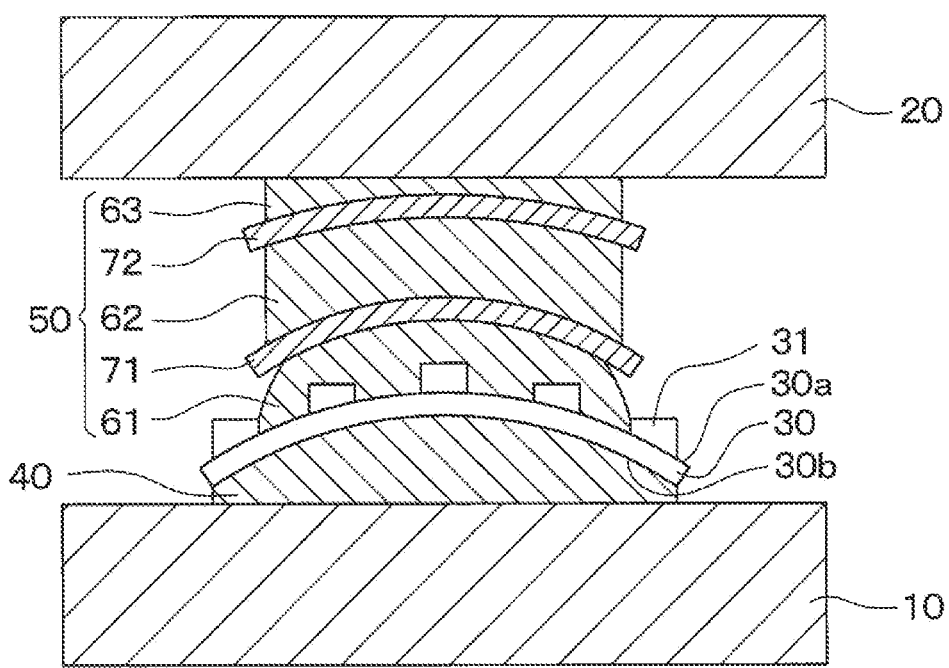
FIG. 1 is a cross-sectional view of a semiconductor device in a first embodiment.

To begin with, examples of relevant techniques will be described.

Conventionally, a semiconductor device in which a semiconductor chip is arranged between a first supporting member and a second supporting member that face each other and a lower layer joining portion is arranged between the semiconductor chip and the first supporting member and an upper joining portion is arranged between the semiconductor chip and the second supporting member has been proposed. In this case, each of the lower layer joining portion and the upper layer joining portion is formed of a pressure-sintered layer such as silver to improve the joining reliability and thermal conductivity between the semiconductor chip and the first and second supporting portions.

However, when the semiconductor chip includes a semiconductor element such as a MOSFET element or an IGBT element, an electrode and a gate wiring are formed on one surface of the semiconductor chip that faces the second supporting member. Therefore, the one surface of the semiconductor chip has protrusions formed of the electrode, the gate wiring, and the like. On the other surface of the semiconductor chip facing the first supporting member, another electrode is entirely formed. Thus, the other surface has a flat surface. MOSFET is an abbreviation for Metal Oxide Semiconductor Field Effect Transistor, and IGBT is an abbreviation for Insulated Gate Bipolar Transistor.

In this case, for example, when arranging the second supporting member on the one surface of the semiconductor chip through an upper joining material and heating and pressurizing the upper joining material to form the upper layer joining portion that is formed of a pressure-sintered layer and to join the upper layer joining portion and the second supporting member, stress may be concentrated on the protrusions of the semiconductor chip. Thus, the semiconductor chip may be damaged.

Therefore, for example, the following manufacturing method has been proposed. That is, in this manufacturing method, the second supporting member defines recesses corresponding to the protrusions. Next, a sintering sheet for forming the pressure-sintered layer is arranged on an area of the second supporting member that is different from the recesses. Next, the second supporting member is arranged on the semiconductor chip through the sintering sheet so that the protrusions and the recesses of the second supporting member face each other. Specifically, the second supporting member is arranged on the semiconductor chip such that the protrusions are housed in the recesses of the second supporting member without contact between the second supporting member and the protrusions of the semiconductor chip. Then, the sintering sheet is heated and pressurized to form the upper layer joining portion formed of the pressure-sintered layer, and the semiconductor chip and the second supporting member are joined through the upper layer joining portion.

According to this, since the protrusions of the semiconductor chip and the second supporting member are arranged away from each other, concentration of stress on the protrusions of the semiconductor chip can be avoided. Therefore, it is possible to inhibit the breakdown of the semiconductor chip.

The lower layer joining portion is formed by, for example, arranging the semiconductor chip on the first supporting member through the lower joining material to be the lower joining member, heating and pressurizing it through a cushioning member. In this case, since the semiconductor chip is pressurized through the cushioning member, stress concentration on the protrusions of the semiconductor chip can be avoided.

However, in the above-mentioned manufacturing method of Non-Patent Literature 1, when the semiconductor chip is warped, the second supporting member may come into contact with the protrusions. If pressure is applied in this state, the portion to be joined may be not evenly pressurized and stress may be concentrated on the protrusions. Thus, breakdown of the semiconductor chip may occur.

Therefore, for example, it is conceivable to increase the depth of the recesses of the second supporting member so that the protrusions and the second supporting member do not come into contact with each other even if the semiconductor chip is warped. However, in this method, the joining area between the second supporting member (that is, the upper layer joining portion) and the semiconductor chip becomes small, and the joining reliability and thermal conductivity may decrease.

It is an objective of the present disclosure to provide a semiconductor device and a method for manufacturing the same, which can improve joining reliability and thermal conductivity while suppressing breakdown of the semiconductor chip.

According to one aspect of the present disclosure, a method for producing a semiconductor device that includes a semiconductor chip between a first supporting member and a second supporting member facing each other is provided. The method includes preparing the semiconductor chip including one surface having a plurality of protrusions and another surface opposite to the one surface, joining the first supporting member to the other surface of the semiconductor chip through a lower layer joining portion such that the other surface faces the first supporting member, and joining the second supporting member to the one surface of the semiconductor chip through an upper layer joining portion such that the one surface faces the second supporting member. The lower layer joining portion includes a pressure-sintered layer and the upper layer joining portion includes a pressure-sintered layer. The joining of the second supporting member to the one surface through the upper layer joining portion includes: forming, on the one surface, a pre-joining layer by pressure-sintering a first constituent member containing a sintering material on the one surface of the semiconductor chip such that spaces between the plurality of protrusions are filled with the pre-joining layer and the pre-joining layer is in contact with the plurality of protrusions and has a flat surface on a side of the pre-joining layer away from the semiconductor chip; arranging, on the flat surface of the pre-joining layer, the second supporting member through a second constituent member containing a sintering material; and heating and pressurizing the second constituent member. The upper layer joining portion is formed by the second constituent member and the pre-joining layer.

According to this, since the pre-joining layer has a flat surface on the side of the pre-joining layer away from the semiconductor chip, when the second constituent member is pressurized and the upper layer joining portion is formed by the second constituent member and the pre-joining layer, the entire portion of the pre-joining layer to be joined to the second constituent member is evenly pressurized. Therefore, it is possible to suppress the stress concentration on the protrusions of the semiconductor chip, and it is possible to suppress the breakdown of the semiconductor chip. Further, the upper layer joining portion (that is, the pre-joining layer) is arranged such that spaces between the protrusions are filled with the upper layer joining portion and the upper layer joining portion is in contact with the protrusions. Therefore, a semiconductor device that can increase the contact area between the upper layer joining member and the semiconductor chip can be manufactured. Therefore, it is possible to manufacture a semiconductor device that can improve the joining reliability and thermal conductivity between the semiconductor chip and the second supporting member.

Further, according to another aspect of the present disclosure, a semiconductor device includes a first supporting member, a second supporting member, a semiconductor chip, a lower layer joining portion, an upper layer joining portion. The semiconductor chip is disposed between the first supporting member and the second supporting member that face each other. The semiconductor chip includes one surface that includes a plurality of protrusions and faces the first supporting member and another surface that is opposite to the one surface and faces the second supporting member. The lower layer joining portion is disposed between the first supporting member and the semiconductor chip and formed of a pressure sintered layer. The upper layer joining portion is disposed between the second supporting member and the semiconductor chip. The upper layer joining portion includes a plurality of pressure-sintered layers and at least one intermediate metal layer disposed, as a supporting layer, between the plurality of pressure-sintered layers. One of the plurality of pressure-sintered layers facing the semiconductor chip is arranged to join the one surface of the semiconductor chip and the at least one intermediate metal layer such that spaces between the plurality of protrusions are filled with the one of the plurality of pressure-sintered layers and the one of the plurality of pressure-sintered layers is in contact with the plurality of protrusions. One of the plurality of pressure-sintered layers facing the second supporting member is arranged to join the at least one intermediate metal layer and the second supporting member.

According to this, the upper layer joining portion (that is, the pre-joining layer) is arranged to be in contact with the protrusions such that spaces between the protrusions are filled with the upper layer joining portion. Therefore, it is possible to increase the joining area between the upper layer joining portion and the semiconductor chip. Therefore, it is possible to improve the joint reliability and thermal conductivity between the semiconductor chip and the second supporting member.

Further, the upper layer joining portion has an intermediate metal layer. When the intermediate metal layer is formed of a bulk metal layer, the atomic density is higher than that of the sintered layer, so that the thermal conductivity can be further improved. Further, when the intermediate metal layer is formed of a sintered layer of silver or copper and the sintered layer has a higher atomic density than the sintered layers sandwiching the intermediate metal layer, the thermal conductivity can be further improved. On the other hand, when the intermediate metal layer is formed of a sintered layer of silver or copper and the atomic density of the sintered layer is lower than those of the sintered layers sandwiching the intermediate metal layer, the intermediate metal layer can be used as a joining layer having a low elastic modulus. Therefore, the stress generated on the semiconductor chip can be reduced, and the reliability can be improved. Further, when the intermediate metal layer is used as a joining layer having a low elastic modulus, the strength of the intermediate metal layer becomes small. Therefore, when some malfunctions occur in the semiconductor device, the intermediate metal layer is firstly damaged and it is possible to suppress the breakdown of the semiconductor chip. Further, since the upper layer joining portion has the intermediate metal layer, the thickness of the upper layer joining portion can be easily adjusted, and the degree of freedom in design can be improved.

Embodiments of the present disclosure will be described with reference to the drawings. In the following embodiments, the same reference numerals are assigned to parts that are the same as or equivalent to each other for descriptive purpose.

First Embodiment

A first embodiment will be described with reference to the drawings. As shown in FIG. 1, a semiconductor device of this embodiment includes a first supporting member 10, a second supporting member 20, and a semiconductor chip 30. The semiconductor device further includes a lower layer joining portion 40, an upper layer joining portion 50, and the like.

The first supporting member 10 is formed of, for example, a DBC (abbreviation for Direct Bonded Copper) substrate, an AMB (abbreviation for Active Metal Brazed copper) substrate, a heat sink, or the like. The second supporting member 20 is formed of, for example, a DBC substrate, an AMB substrate, a heat sink, a terminal, or the like.

The semiconductor chip 30 is made of silicon, silicon carbide, or the like, and for example, a semiconductor element such as a MOSFET element or an IGBT element is formed on the semiconductor chip 30. Although a detailed description of the configuration of the semiconductor chip 30 is omitted, the semiconductor chip 30 includes one surface 30*a* on which a one-surface electrode and a gate wiring are formed and the other surface 30*b* on which an another-surface electrode is formed such that current flows between the one surface 30*a* and the other surface 30*b*.

Further, the semiconductor chip 30 of the present embodiment is warped so that the one surface 30*a* curves convexly. Since different members such as the one-surface electrode and the gate wiring are formed on the one surface 30*a* of the semiconductor chip 30, the one surface 30*a* includes protrusions 31. That is, the semiconductor chip 30 is warped such that the one surface 30*a* curves convexly and the protrusions 31 are formed on the one surface 30*a*. For example, on the one surface 30*a* of the semiconductor chip 30, the portions where the gate wiring is covered with a protective film are the protrusions 31. Thus, the outer surface of the protrusions 31 are formed of the protective film. Then, on the one surface 30*a* of the semiconductor chip 30, the one-surface electrode is exposed outward not to overlap the protrusions 31 (that is, the protective film). In contrast, the other-surface electrode is formed entirely on the other surface 30*b* of the semiconductor chip 30. Hereinafter, the protrusions 31 on the one surface 30*a* of the semiconductor chip 30 are simply referred to as the protrusions 31 of the semiconductor chip 30.

The semiconductor chip 30 is arranged between the first supporting member 10 and the second supporting member 20 such that the other surface 30*b* faces the first supporting member 10 and the one surface 30*a* faces the second supporting member 20.

The lower layer joining portion 40 is arranged between the first supporting member 10 and the semiconductor chip 30 to electrically and mechanically join the first supporting member 10 and the other-surface electrode formed on the other surface 30*b* of the semiconductor chip 30. In the present embodiment, the lower layer joining portion 40 is formed of a pressure-sintered layer in which silver particles are pressure-sintered.

The upper layer joining portion 50 is arranged between the second supporting member 20 and the semiconductor chip 30 to electrically and mechanically join the second supporting member 20 and the one-surface electrode formed on the one surface 30*a* of the semiconductor chip 30.

Specifically, the upper layer joining portion 50 has a structure in which a first pressure-sintered layer 61, an intermediate metal layer 71, a second pressure-sintered layer 62, an intermediate metal layer 72, and a third pressure-sintered layer 63 are laminated in this order from the semiconductor chip 30. That is, in the upper layer joining portion 50, the intermediate metal layer 71 is sandwiched between the first pressure-sintered layer 61 and the second pressure-sintered layer 62 in a stacking direction of the first supporting member 10 and the second supporting member 20, and the intermediate metal layer 72 is sandwiched between the second pressure-sintered layer 62 and the third pressure-sintered layer 63 in the stacking direction.

In this embodiment, the first to third pressure-sintered layers 61 to 63 are formed of pressure-sintered layers in which silver particles are pressure-sintered. The intermediate metal layers 71 and 72 are formed of bulk metal layers of silver, and have a higher atomic density than the first to third pressure-sintered layers 61 to 63.

Then, the first pressure-sintered layer 61 of the upper layer joining portion 50 is arranged to be in contact with the protrusions 31 such that spaces between the protrusions 31 are filled with the first pressure-sintered layer 61. That is, in the semiconductor chip 30, all of the portions that are exposed outward between adjacent protrusions 31 (for example, the entire of the one-surface electrode) are joined to the first pressure-sintered layer 61.

The configuration of the semiconductor device in this embodiment is as described above. Next, a method for manufacturing the semiconductor device will be described with reference to FIGS. 2A to 2E. The following manufacturing method may also be referred to as a BESiP (abbreviation for Build Even Surface in Process) method.

Figure 2A:
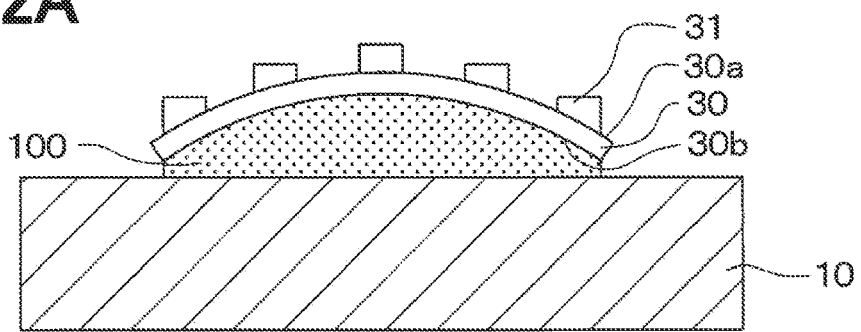
FIG. 2A is a cross-sectional view illustrating a manufacturing step of the semiconductor device of FIG. 1.

First, as shown in FIG. 2A, the semiconductor chip 30 having the protrusions 31 on the one surface 30a is prepared. As described above, the semiconductor chip 30 of the present embodiment is warped such that the one surface 30a curves convexly. That is, the semiconductor chip 30 of the present embodiment is warped such that the one surface 30a curves convexly and the protrusions 31 are formed on the one surface 30a.

Then, the semiconductor chip 30 is placed on the first supporting member 10 through a lower layer sheet 100 containing silver particles as a sintering material. In the present embodiment, the lower layer sheet 100 is transferred to the other surface 30b of the semiconductor chip 30 in advance, and the semiconductor chip 30 with the lower layer sheet 100 is arranged on the first supporting member 10 through the lower layer sheet 100. In this case, in order to prevent positional shift of the first supporting member 10, the lower layer sheet 100, and the semiconductor chip 30 during transportation or the like, anti-slip tack material may be arranged between the first supporting member 10 and the lower layer sheet 100. As the tack material, for example, a sintering silver paste, a solvent for forming the sintering silver paste, or the like can be used.

In this embodiment, the lower layer sheet 100 corresponds to the lower layer joining member. Further, when transferring the lower layer sheet 100 to the other surface 30b of the semiconductor chip 30, for example, the following method can be adopted. That is, at first, a sintering material containing silver particles for constituting the lower layer sheet 100 is placed on a jig or the like. In this case, the sintering material may be a paste or a sheet. Then, the other surface 30b of the semiconductor chip 30 is brought into contact with the sintering material, and pressurized while being heated. As a result, the sintering material is transferred to the other surface 30b of the semiconductor chip 30, and the lower layer sheet 100 is arranged on the other surface 30b of the semiconductor chip 30. The heating temperature and pressurizing force in the transferring are adjusted so that the transferred lower sheet 100 is not sintered.

Figure 2B:
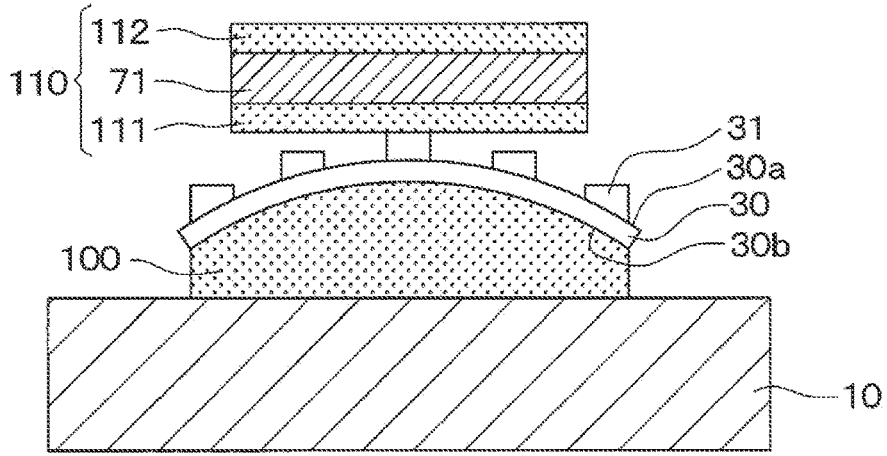
FIG. 2B is a cross-sectional view illustrating a manufacturing step of the semiconductor device subsequent to the step shown in FIG. 2A.

Next, as shown in FIG. 2B, a first constituent member 110 is arranged on the one surface 30a of the semiconductor chip 30. In the present embodiment, the first constituent member 110 has a first sheet 111 and a second sheet 112 each containing silver particles as a sintering material, and an intermediate metal layer 71 as a supporting layer. The intermediate metal layer 71 is arranged between the first sheet 111 and the second sheet 112. That is, the first constituent member 110 of the present embodiment has a three layer preformed structure in which the first sheet 111 and the second sheet 112 are arranged on the front and back surfaces of the intermediate metal layer 71 as a supporting layer for easy handling. The first constituent member 110 is arranged so that the first sheet 111 is on the semiconductor chip 30. In this case, in order to prevent positional shifts of the semiconductor chip 30 and the first constituent member 110 during transportation or the like, an anti-slip tack material may be arranged between the semiconductor chip 30 and the first constituent member 110. As the tack material, for example, a sintering silver paste, a solvent for forming the sintering silver paste, or the like can be used.

Each of the first sheet 111 and the second sheet 112 is formed of a silver sheet obtained by evaporating and removing a solvent from a silver paste containing silver particles, and transferred to and arranged on the intermediate metal layer 71. However, the first sheet 111 and the second sheet 112 have not sintered yet. Further, the intermediate metal layer 71 of the present embodiment is formed of a silver bulk metal layer as described above.

Figure 2C:
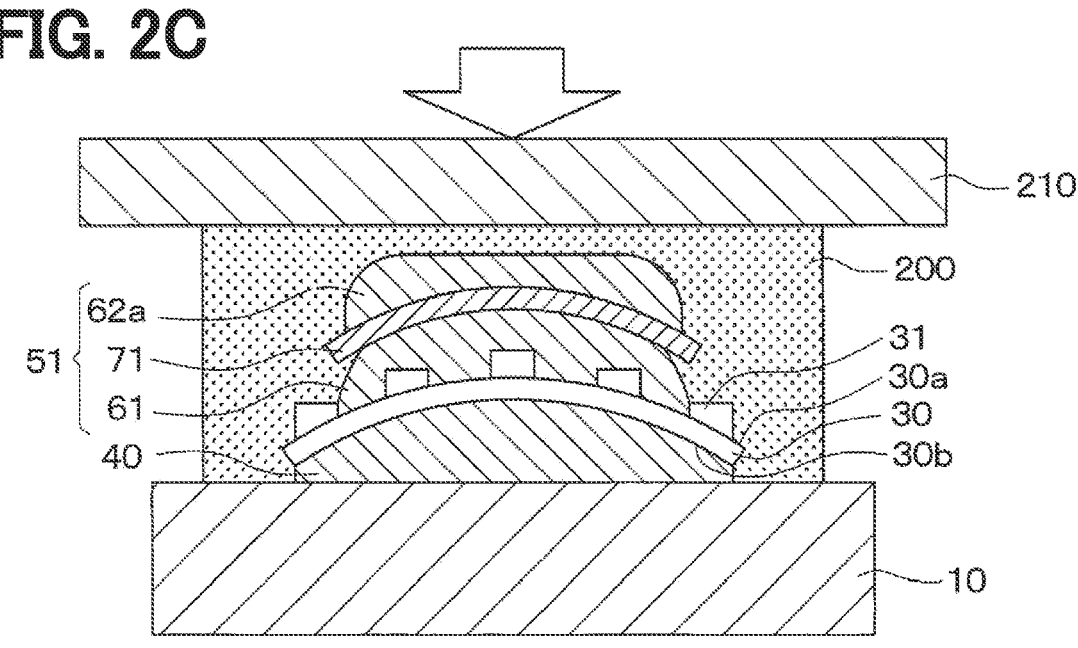
FIG. 2C is a cross-sectional view illustrating a manufacturing step of the semiconductor device subsequent to the step shown in FIG. 2B.

After that, as shown in FIG. 2C, a cushioning member 200 is arranged to cover the semiconductor chip 30 and the first constituent member 110. Then, the pressure is applied to them through the cushioning member 200 by a pressurizing device 210 while heating them. That is, in the present embodiment, the lower layer sheet 100 and the first constituent member 110 are simultaneously heated and pressurized.

As a result, the lower layer sheet 100 is heated and pressurized to form the lower layer joining portion 40 which is a pressure-sintered layer, and the first supporting member 10 and the semiconductor chip 30 are joined through the lower layer joining portion 40.

Further, the first constituent member 110 is heated and pressurized to form a pre-joining layer 51. Specifically, the first sheet 111 in the first constituent member 110 is heated and pressurized to form the first pressure-sintered layer 61. At this time, the first pressure-sintered layer 61 is deformed to be in contact with the protrusions 31 such that spaces between the protrusions 31 are filled with the first pressure-sintered layer 61. In this case, since the first constituent member 110 is pressurized via the cushioning member 200, pressure is evenly applied to the first constituent member 110 due to deformation of the cushioning member 200. Thus, stress concentration on the protrusions 31 of the semiconductor chip 30 can be avoided. Therefore, it is possible to prevent breaking of the semiconductor chip 30.

Further, the second sheet 112 in the first constituent member 110 is heated and pressurized to form a second lower pressure-sintered layer 62a which is a portion of the second pressure-sintered layer 62 facing the semiconductor chip 30. At this time, since the second lower pressure sintered layer 62a is pressurized by the pressurizing device 210 via the cushioning member 200, the surface opposite to the semiconductor chip 30 becomes flat.

As a result, on the one surface 30a of the semiconductor chip 30, the pre-joining layer 51 that is joined to the one surface 30a of the semiconductor chip 30 and has a flat surface on the side of the pre-joining layer 51 away from the semiconductor chip 30 is arranged.

Figure 2D:
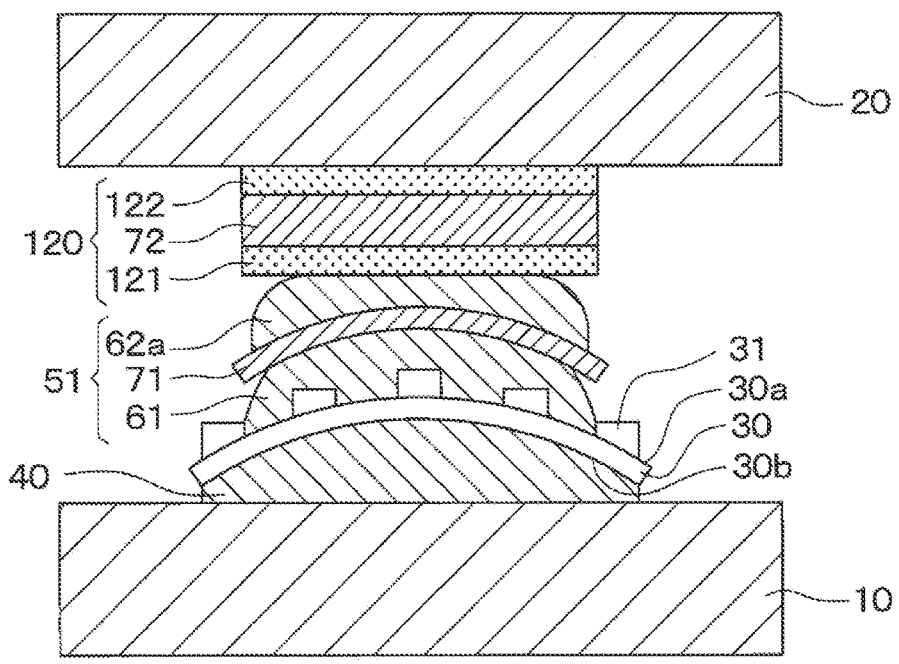
FIG. 2D is a cross-sectional view illustrating a manufacturing step of the semiconductor device subsequent to the step shown in FIG. 2C.

Next, as shown in FIG. 2D, the second supporting member 20 is arranged on the pre-joining layer 51 through a second constituent member 120. The second constituent member 120 of the present embodiment has the same configuration as the first constituent member 110. That is, the second constituent member 120 has a first sheet 121 and a second sheet 122 that contain silver particles as a sintering material, and an intermediate metal layer 72 arranged between the first sheet 121 and the second sheet 122. That is, the second constituent member 120 of the present embodiment has a three layer preformed structure in which the first sheet 121 and the second sheet 122 are arranged on the front and back surfaces of the intermediate metal layer 72 as a supporting layer for easy handling. Then, the second constituent member 120 is arranged so that the first sheet 121 faces the pre-joining layer 51. In this case, in order to prevent positional shifts of the pre-joining layer 51 and the second constituent member 120 during transportation or the like, an anti-slip tack material may be arranged between the pre-joining layer 51 and the second constituent member 120. As the tack material, for example, a sintering silver paste, a solvent for forming the sintering silver paste, or the like can be used.

Figure 2E:
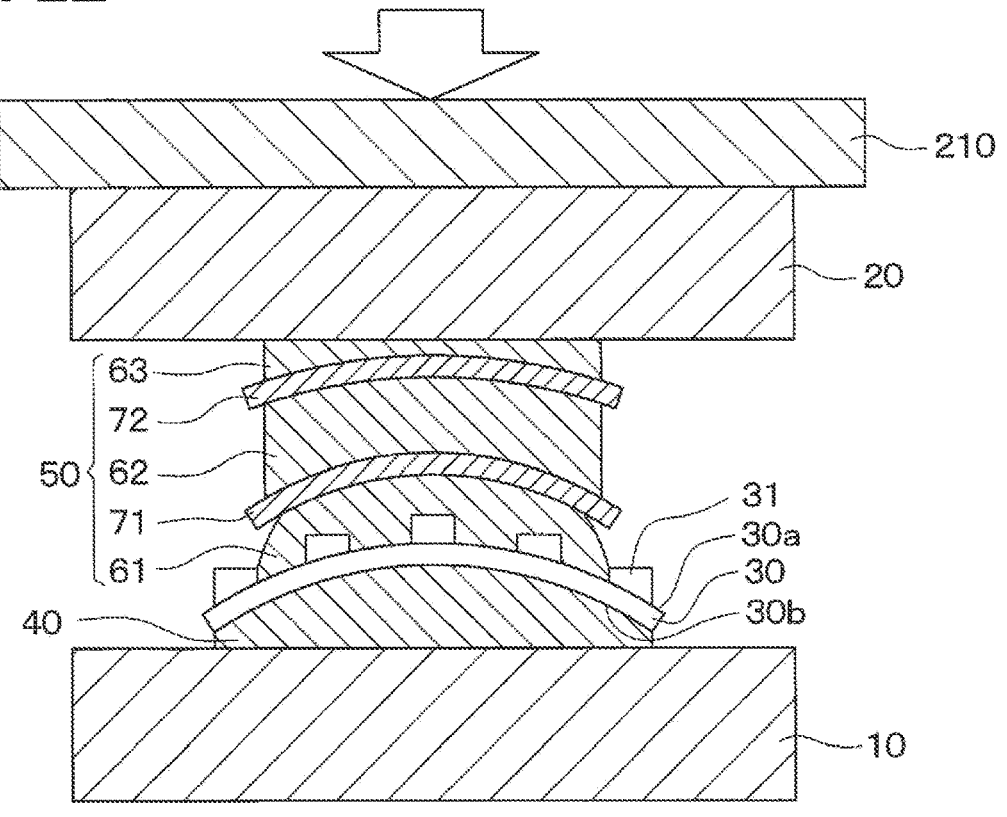
FIG. 2E is a cross-sectional view illustrating a manufacturing step of the semiconductor device subsequent to the step shown in FIG. 2D.

Next, as shown in FIG. 2E, pressure is applied to them by the pressurizing device 210 while heating them. As a result, the first sheet 121 in the second constituent member 120 is pressure-sintered, so that the pressure-sintered first sheet 121 is joined to the second lower pressure-sintered layer 62a to form the second pressure-sintered layer 62. Further, the second sheet 122 in the second constituent member 120 is pressure-sintered to form the third pressure-sintered layer 63. Thereby, the semiconductor device shown in FIG. 1 is manufactured.

At this time, since the surface of the pre-joining layer 51 away from the semiconductor chip 30 is flat, the entire portion of the pre-joining layer 51 to be joined to the second sheet 122 is evenly pressurized. Therefore, it is possible to suppress the stress concentration on the protrusions 31 due to this pressurization. That is, in the present embodiment, it is possible to avoid stress concentration on the protrusions 31 of the semiconductor chip 30 when the pressure is applied to form the upper layer joining portion 50. Therefore, it is possible to prevent breaking of the semiconductor chip 30.

According to the present embodiment described above, before the second supporting member 20 is arranged on the semiconductor chip 30, the pre-joining layer 51 is arranged to be in contact with the protrusions 31 such that the spaces between the protrusions 31 are filled with the pre-joining layer 51 and to have a flat surface on the side of the pre-joining layer 51 away from the semiconductor chip 30. Then, the second supporting member 20 is arranged on the flat surface of the pre-joining layer 51 through the second constituent member 120, and by heating and pressurizing them, the upper layer joining portion 50 including the pressure-sintered layer is formed. The upper layer joining portion 50 is formed by the second constituent member 120 and the pre-joining layer 51.

At this time, the pre-joining layer 51 having a flat surface on the side of the pre-joining layer 51 away from the semiconductor chip 30 is arranged, and the entire portion of the flat surface to be joined to the second constituent member 120 is evenly pressurized. Therefore, it is possible to avoid the stress concentration on the protrusions 31 of the semiconductor chip 30, and to avoid breaking the semiconductor chip 30. Further, since the upper layer joining portion 50 is arranged to be in contact with the protrusions 31 such that the spaces between the protrusions 31 are filled with the upper layer joining portion 50, it is possible to increase the contact area of the upper layer joining portion 50 with the semiconductor chip 30. Therefore, it is possible to improve the joining reliability and thermal conductivity between the semiconductor chip 30 and the second supporting member 20.

Further, the pre-joining layer 51 is formed by arranging the first constituent member 110 on the semiconductor chip

30 and heating and pressurizing the first constituent member 110 via the cushioning member 200. Therefore, also during this pressurization, it is possible to avoid stress concentration on the protrusions 31 of the semiconductor chip 30, and it is possible to avoid breaking of the semiconductor chip 30.

Further, in the present embodiment, heating and pressurizing the lower layer sheet 100 to form the lower layer joining portion 40 and heating and pressurizing the first constituent member 110 to forming the pre-joining layer 51 are performed at the same time. Therefore, the manufacturing process can be simplified.

Further, in the present embodiment, the upper layer joining portion 50 includes the first to third pressure-sintered layers 61 to 63 each formed of the pressure-sintered layer and the intermediate metal layers 71 and 72. The intermediate metal layers 71 and 72 of the present embodiment are formed of bulk metal layers. Therefore, since the intermediate metal layers 71 and 72 having high atomic density are disposed in this embodiment, the thermal conductivity can be further improved compared to the case where the upper layer joining portion 50 is formed only of the first to third pressure-sintered layers 61 to 63. In this case, since the plurality of intermediate metal layers 71 and 72 are arranged in the present embodiment, the thermal conductivity can be further improved.

Further, since the upper layer joining portion 50 includes the intermediate metal layers 71 and 72 as supporting layers, the thickness of the upper layer joining portion 50 can be easily adjusted as compared with the case where the upper layer joining portion 50 is formed only of the first to third pressure-sintered layers 61 to 63. Therefore, the stress design value relaxed by the upper layer joining portion 50 can be easily adjusted, and the degree of freedom in design can be improved.

OTHER EMBODIMENTS

Although the present disclosure has been described in accordance with the embodiments, it is understood that the present disclosure is not limited to such embodiments or structures. The present disclosure encompasses various modifications and variations within the scope of equivalents. In addition, various combinations and forms, and further, other combinations and forms including only one element, or more or less than these elements are also within the sprit and the scope of the present disclosure.

For example, in the first embodiment, the upper layer joining portion 50 may be formed only of the pressure-sintered layer without the intermediate metal layers 71 and 72.

Further, in the first embodiment, the upper layer joining portion 50 may have, for example, one intermediate metal layer or three or more intermediate metal layers.

Further, in the first embodiment, the intermediate metal layers 71 and 72 may be formed of a bulk metal layer made of copper or aluminum instead of the bulk metal layer of silver. That is, the intermediate metal layers 71 and 72 may be made of a metal different from the metal for the first to third pressure-sintered layers 61 to 63. When the intermediate metal layers 71 and 72 are made of a metal material different from the metal material of the first to third pressure-sintered layers 61 to 63, the joint strength between the intermediate metal layers 71, 72 and the first to third pressure-sintered layers 61 to 63 can be decreased compared to the case where the intermediate metal layers 71, 72 are made of the same material with the first to third pressure-sintered layers 61 to 63. Therefore, when some malfunctions occur in the semiconductor chip 30, breaking is likely to occur at the joint boundaries between the intermediate metal layers 71,72 and the first to third pressure-sintered layers 61 to 63. Therefore, breaking of the semiconductor chip 30 can be avoided. When the intermediate metal layers 71 and 72 are made of the same material as the first to third pressure-sintered layers 61 to 63, the joint strength between the intermediate metal layers 71,72 and the first to third pressure-sintered layers 61 to 63 can be increased.

Further, in the first embodiment, the intermediate metal layers 71 and 72 may be formed of a sintered layer containing silver or copper as a main component. In this case, when arranging the first constituent member 110 as shown in FIG. 2B, the sintered layer formed into a film in advance through a sintering reaction is used as the intermediate metal layer 71, and the first constituent member 110 in which the intermediate metal layer 71 is interposed between the first sheet 111 and the second sheet 112 is arranged on the one surface 30a of the semiconductor chip 30. Similarly, when arranging the second constituent member 120 as shown FIG. 2D, the sintered layer formed into a film in advance through a sintering reaction may be used as the intermediate metal layer 72, and the second constituent member 120 in which the intermediate metal layer 72 is interposed between the first sheet 121 and the second sheet 122 may be arranged on the pre-joining layer 51.

When the sintered layers constituting the intermediate metal layers 71 and 72 have a higher atomic density than the first sheets 111, 121 and the second sheets 121, 122, the thermal conductivity can be improved. Further, when the sintered layers constituting the intermediate metal layers 71 and 72 have lower atomic densities than the first sheets 111, 121 and the second sheets 121, 122, the intermediate metal layers 71 and 72 can be a joining layer having a low elastic modulus. Therefore, the stress generated on the semiconductor chip 30 can be reduced, and the reliability can be improved. Further, when the intermediate metal layers 71 and 72 are joining layers having a low elastic modulus, the strength of the intermediate metal layers 71 and 72 decreases. Therefore, when some malfunctions occur in the semiconductor device, it is possible to suppress the breakdown of the semiconductor chip 30 by firstly breaking the intermediate metal layers 71 and 72.

Further, in the first embodiment, the first constituent member 110 may not have the first and second sheets 111 and 112 and have a silver paste that is formed by adding silver particles into a solvent such as alcohol and ethylene glycol. Further, the first constituent member 110 may not include the intermediate metal layer 71 and may be formed only of the first sheet 111 or the silver paste. Similarly, the second constituent member 120 may not have the first and second sheets 121, 122 and have a silver paste that is formed by adding silver particles into a solvent such as alcohol and ethylene glycol. Further, the second constituent member 120 may not include the intermediate metal layer 72 and may be formed only of the first sheet 121 or the silver paste.

Then, in the first embodiment, the upper layer joining portion 50 may contain other metal particles. For example, the first constituent member 110 may contain a copper paste that is formed by adding copper particles in a solvent such as alcohol or ethylene glycol, or may be formed of a copper sheet that is formed by removing the solvent from the copper paste. Similarly, the second constituent member 120 may contain a copper paste that is formed by adding copper particles in a solvent such as alcohol or ethylene glycol, or may be formed of a copper sheet that is formed by removing the solvent from the copper paste. In this case, the intermediate metal layers 71 and 72 may be made of silver, copper, or aluminum.

Further, in the first embodiment, the lower layer joining portion 40 may contain copper, similarly to the upper layer joining portion 50.

Further, in the first embodiment, when arranging the semiconductor chip 30 on the first supporting member 10 via the lower layer sheet 100, the following steps may be performed. That is, after the lower layer sheet 100 separately formed from the semiconductor chip 30 is arranged on the first supporting member 10, the semiconductor chip 30 may be arranged on the lower layer sheet 100.

Then, in the first embodiment, step of heating and pressurizing the lower layer sheet 100 to form the lower layer joining portion 40 may be different from the step of heating and pressurizing the first constituent member 110 to form the pre-joining layer 51.

Further, in the first embodiment, an example in which the semiconductor chip 30 is warped such that the one surface 30a curves convexly has been described. However, the semiconductor chip 30 may be warped such that the other surface 30b curves convexly. Even in the case of manufacturing a semiconductor device using such semiconductor chip 30, since the protrusion 31 is formed on the one surface 30a, the same or similar advantages to those of the first embodiment can be obtained by performing the same manufacturing method as the first embodiment.

Further, in the first embodiment, an example in which the pre-joining layer 51 is joined to the one-surface electrode disposed between the protrusions 31 of the semiconductor chip 30 and exposed outward has been described. However, in the semiconductor chip 30, the gate pad may be exposed at a position different from the portion between the protrusions 31. Therefore, a pre-joining layer may be formed on the gate pad as well. However, when the pre-joining layer is arranged on the gate pad, the pre-joining layer 51 joined to the one-surface electrode exposed outward at the portion between the protrusions 31 should be insulated from the pre-joining layer joined to the gate pad arranged in the portion different from the portion between the protrusions 31. When the pre-joining layer is arranged on the gate pad, a wire, a terminal, or the like that is connected to an external circuit may be connected to the pre-joining layer joined to the gate pad. When forming the pre-joining layer joined to the gate pad, this pre-joining layer is formed at the same time as the step of forming the pre-joining layer 51 joined to the one-surface electrode, so that the manufacturing process can be simplified.

What is claimed is:

1. A method for producing a semiconductor device that includes a semiconductor chip between a first supporting member and a second supporting member facing each other, the method comprising:

preparing the semiconductor chip that is warped and includes one surface having a plurality of protrusions and another surface opposite to the one surface;

joining the first supporting member to the other surface of the semiconductor chip through a lower layer joining portion such that the other surface faces the first supporting member, the lower layer joining portion including a pressure-sintered layer; and joining the second supporting member to the one surface of the semiconductor chip through an upper layer joining portion such that the one surface faces the second supporting member, the upper layer joining portion including a pressure-sintered layer, wherein joining the second supporting member to the one surface through the upper layer joining portion further includes:

heating and pressurizing a first constituent member containing a sintering material on the one surface of the semiconductor chip that is warped to form a pre-joining layer on the one surface of the semiconductor chip, wherein spaces between the plurality of protrusions are filled with the pre-joining layer and the pre-joining layer is in contact with the plurality of protrusions and has a flat surface on a side of the pre-joining layer away from the semiconductor chip; thereafter arranging, on the flat surface of the pre-joining layer, the second supporting member through a second constituent member containing a sintering material; and heating and pressurizing the second constituent member, wherein the upper layer joining portion is formed by the second constituent member and the pre-joining layer.

2. The method according to claim 1, wherein heating and pressurizing the first constituent member to form the pre-joining layer includes:

arranging the first constituent member on the one surface of the semiconductor chip; and pressurizing the first constituent member through a cushioning member while heating the first constituent member to form the pre-joining layer from the first constituent member.

3. The method according to claim 2, wherein joining the first supporting member to the other surface of the semiconductor chip through the lower layer joining portion further includes:

arranging the semiconductor chip on the first supporting member through a lower layer joining member containing a sintering material; and heating and pressurizing the lower layer joining member to form the lower layer joining portion from the lower layer joining member, and pressurizing the lower layer joining member to form the lower layer joining portion is performed at a same time with pressurizing the first constituent member.

4. The method according to claim 1, wherein the first constituent member is formed of a silver paste in which silver particles are contained in a solvent, a silver sheet formed by removing the solvent from the silver paste, a preformed structure in which an intermediate metal layer as a supporting layer is sandwiched by silver sheets, a copper paste in which copper particles are contained in a solvent, a copper sheet formed by removing the solvent from the copper paste, or a preformed structure in which an intermediate metal layer is sandwiched by copper sheets, when the first constituent member is formed of a preformed structure in which the intermediate metal layer is sandwiched by silver sheets or copper sheets, the intermediate metal layer is formed of a bulk metal layer made of silver, copper or aluminum, or a sintered layer mainly composed of silver or copper.

5. A semiconductor device comprising:

a first supporting member;

a second supporting member:

a semiconductor chip disposed between the first supporting member and the second supporting member that face each other, the semiconductor chip including one surface that is warped and includes a plurality of protrusions and faces the second supporting member and the other surface that is opposite to the one surface and faces the first supporting member;

a lower layer joining portion disposed between the first supporting member and the semiconductor chip and formed of a pressure-sintered layer; and an upper layer joining portion disposed between the second supporting member and the semiconductor chip, wherein the upper layer joining portion includes:

a plurality of pressure-sintered layers; and a plurality of intermediate metal layers disposed, as a supporting layer, between the plurality of pressure-sintered layers, one of the plurality of pressure-sintered layers facing the semiconductor chip is arranged to join the one surface of the semiconductor chip and the plurality of intermediate metal layers such that spaces between the plurality of protrusions are filled with the one of the plurality of pressure-sintered layers and the one of the plurality of pressure-sintered layers is in contact with the plurality of protrusions, one of the plurality of pressure-sintered layers facing the second supporting member is arranged to join the plurality of intermediate metal layers and the second supporting member, and the plurality of intermediate metal layers are deformed to conform to a warped profile of the one surface of the semiconductor chip.

6. The semiconductor device according to claim 5, wherein the plurality of intermediate metal layers include at least one sintered layer formed by heating and pressing.

7. The semiconductor device according to claim 6, wherein the at least one sintered layer has higher atomic density than the plurality of pressure-sintered layers.

8. The semiconductor device according to claim 6, wherein the at least one sintered layer has lower atomic density than the plurality of pressure-sintered layers.

9. The method according to claim 1, wherein the first constituent member is formed of a silver sheet formed by removing a solvent from a silver paste, a preformed structure in which an intermediate metal layer as a supporting layer is sandwiched by silver sheets, a copper sheet formed by removing a solvent from a copper paste, or a preformed structure in which an intermediate metal layer is sandwiched by copper sheets, and when the first constituent member is formed of a preformed structure in which the intermediate metal layer is sandwiched by silver sheets or copper sheets, the intermediate metal layer is formed of a bulk metal layer made of silver, copper or aluminum, or a sintered layer mainly composed of silver or copper.

10. The method according to claim 1, wherein the first constituent member is formed of a preformed structure in which an intermediate metal layer as a supporting layer is sandwiched by silver sheets, or a preformed structure in which an intermediate metal layer is sandwiched by copper sheets, and the intermediate metal layer is formed of a bulk metal layer made of silver, copper or aluminum, or a sintered layer mainly composed of silver or copper.

11. The method according to claim 9, wherein the first constituent member and the second constituent member are formed of a same material.

12. The method according to claim 1, wherein the first constituent member is formed of a preformed structure in which an intermediate metal layer is sandwiched by silver sheets, and the second constituent member is formed of a preformed structure in which an intermediate metal layer is sandwiched by silver sheets.

13. The semiconductor device according to claim 5, wherein the plurality of intermediate metal layers are formed of a same material.

14. The method according to claim 1, wherein the plurality of protrusions are all on the one surface.

15. The semiconductor device according to claim 5, wherein the plurality of protrusions are all on the one surface.

16. The method according to claim 1, wherein the semiconductor chip is warped such that the one surface is curved convexly or the other surface is curved convexly.

17. The semiconductor device according to claim 5, wherein the one surface is warped such that the one surface is curved convexly or the other surface is curved convexly.

* * * * *